US012723514B2

(12) United States Patent
Kilchyk et al.

(10) Patent No.: US 12,723,514 B2
(45) Date of Patent: Sep. 1, 2026

(54) AIRCRAFT AIRFOIL FORMED FROM THERMALLY ADAPTIVE MATERIALS AND INCLUDING DAMPING ELEMENT, STIFFENING ELEMENT, AND A THERMOELECTRIC JUNCTION

(71) Applicant: Hamilton Sundstrand Corporation, Charlotte, NC (US)

(72) Inventors: Viktor Kilchyk, Lancaster, NY (US); Brent J. Merritt, Southwick, MA (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 0 days.

(21) Appl. No.: 18/533,952

(22) Filed: Dec. 8, 2023

(65) Prior Publication Data

US 2025/0084766 A1 Mar. 13, 2025

Related U.S. Application Data

(63) Continuation-in-part of application No. 18/464,160, filed on Sep. 8, 2023, and a continuation-in-part of (Continued)

(51) Int. Cl.
*F01D 5/28* (2006.01)
*B64C 3/52* (2006.01)
(Continued)

(52) U.S. Cl.
CPC .................. *F01D 5/28* (2013.01); *B64C 3/52* (2013.01); *F01D 5/12* (2013.01); *H10N 10/17* (2023.02)

(58) Field of Classification Search
CPC ... B64C 11/16–11/28; B64C 3/00–3/58; F03D 1/0675–1/069; F01D 5/12–5/288; H10N 10/17
See application file for complete search history.

(56) References Cited

U.S. PATENT DOCUMENTS 3,326,726 A 6/1967 Bassett, Jr. et al.
3,513,881 A 5/1970 Kinsell
(Continued)

FOREIGN PATENT DOCUMENTS

CN 114423927 A 4/2022
DE 10250758 A1 5/2004
(Continued)

OTHER PUBLICATIONS

Kim, Daejong, "Parametric Studies on Static and Dynamic Performance of Air Foil Bearings with Different Top Foil Geometries and Bump Stiffness Distributions", https://doi.org/10.1115/1.2540065; Published Online: Nov. 15, 2006, 9 pages.
(Continued)

*Primary Examiner* — Sang K Kim
(74) *Attorney, Agent, or Firm* — CANTOR COLBURN LLP

(57) ABSTRACT

An airfoil, having: a body defining a leading edge and a trailing edge, wherein the body comprises: a base having an outer boundary extending longitudinally from a first end to a second end and transversely from a first side to a second side; and beads within the outer boundary, wherein each of the beads has a bead void, and wherein one or more of the beads includes: damping element within the bead void; or stiffening element extending across the bead.

20 Claims, 10 Drawing Sheets

Related U.S. Application Data application No. 18/464,159, filed on Sep. 8, 2023, and a continuation-in-part of application No. 18/464,165, filed on Sep. 8, 2023, now abandoned, and a continuation-in-part of application No. 18/464,142, filed on Sep. 8, 2023, and a continuation-in-part of application No. 18/464,164, filed on Sep. 8, 2023, and a continuation-in-part of application No. 18/464,153, filed on Sep. 8, 2023, and a continuation-in-part of application No. 18/464,147, filed on Sep. 8, 2023, and a continuation-in-part of application No. 18/464,163, filed on Sep. 8, 2023, and a continuation-in-part of application No. 18/464,139, filed on Sep. 8, 2023, and a continuation-in-part of application No. 18/464,157, filed on Sep. 8, 2023.

(51) Int. Cl.
*F01D 5/12* (2006.01)
*H10N 10/17* (2023.01)

(56) References Cited

U.S. PATENT DOCUMENTS 3,687,365 A 8/1972 Laessig
4,327,154 A * 4/1982 Rossmann ............ F01D 25/005 419/33
4,418,549 A 12/1983 Courneya
4,441,653 A 4/1984 Grudich
4,454,983 A 6/1984 Tarvis, Jr.
4,851,285 A 7/1989 Brotz
4,939,038 A 7/1990 Inabata
5,230,850 A * 7/1993 Lewis ................ B29D 99/0025 264/112
5,634,189 A 5/1997 Rossmann et al.
5,720,339 A 2/1998 Glass et al.
5,769,389 A 6/1998 Jacobsen et al.
6,100,463 A 8/2000 Ladd et al.
6,161,382 A 12/2000 Brotz
6,182,929 B1 2/2001 Martin et al.
6,371,437 B1 4/2002 Kenny et al.
7,037,076 B2 5/2006 Jacot et al.
7,147,269 B2 12/2006 Aase et al.
7,650,910 B2 1/2010 Welle
7,686,040 B2 3/2010 Welle
7,721,762 B2 5/2010 Welle
7,753,654 B2 * 7/2010 Read ....................... F02C 7/045 416/500
7,770,959 B2 8/2010 Browne et al.
7,854,467 B2 12/2010 Mcknight et al.
7,922,456 B2 4/2011 McMillan
7,967,568 B2 * 6/2011 Dalton .................... F01D 9/041 415/115
8,119,206 B2 * 2/2012 Hougham .......... H01R 13/2414 427/217
8,205,668 B2 6/2012 Freese, V.
9,181,933 B2 11/2015 Daly et al.
9,719,536 B2 8/2017 Ashmawi et al.
9,752,442 B2 9/2017 Hayford et al.
9,784,126 B2 10/2017 Army et al.
9,897,078 B2 2/2018 Nicholson et al.
9,919,470 B2 3/2018 Behl et al.
9,981,421 B2 5/2018 Marcoe et al.
10,053,239 B2 8/2018 Mabe et al.
10,543,897 B2 1/2020 Brown et al.
10,731,666 B2 8/2020 Skertic
10,815,976 B2 10/2020 Kaneko et al.
10,976,119 B2 4/2021 Veto et al.
10,982,783 B2 4/2021 Srinivasa Murthy
11,008,943 B2 5/2021 Tajiri et al.
11,110,647 B2 9/2021 Marcoe et al.
11,167,836 B2 * 11/2021 Hethcock, Jr. ............ B64C 3/26
11,192,333 B2 12/2021 Hahnlen
11,248,592 B1 2/2022 Tsuruta et al.
11,268,520 B2 3/2022 Melo et al.
11,359,287 B2 6/2022 Philibert
11,655,346 B2 5/2023 Jackson et al.
11,668,316 B1 6/2023 Kilchyk et al.
12,162,606 B1 12/2024 Merritt et al.
12,384,515 B2 8/2025 Kilchyk et al.
2001/0008357 A1 7/2001 Dhuler et al.
2003/0025093 A1 2/2003 Kenny et al.
2005/0005983 A1 1/2005 Lewis
2007/0140862 A1 * 6/2007 McMillan ............... F01D 25/24 416/232
2007/0171257 A1 7/2007 Yang
2007/0184238 A1 8/2007 Hockaday et al.
2008/0196430 A1 8/2008 McGill et al.
2008/0236668 A1 10/2008 Beerling et al.
2008/0302024 A1 12/2008 Browne et al.
2010/0028205 A1 2/2010 Ponjee et al.
2010/0304063 A1 12/2010 McCrea et al.
2011/0284645 A1 11/2011 Tiliakos et al.
2012/0255278 A1 10/2012 Miao et al.
2013/0048135 A1 2/2013 Blumenthal et al.
2013/0255796 A1 10/2013 Dimascio et al.
2013/0255815 A1 10/2013 Brinkmann et al.
2013/0287555 A1 10/2013 Rosen et al.
2014/0186161 A1 7/2014 Colson et al.
2015/0033730 A1 2/2015 Beers et al.
2015/0239046 A1 8/2015 McMahan et al.
2016/0025078 A1 1/2016 Li et al.
2016/0160353 A1 6/2016 Miarecki et al.
2016/0160869 A1 6/2016 Roach et al.
2016/0186575 A1 6/2016 Lacy et al.
2017/0001263 A1 1/2017 Steiner
2017/0227019 A1 8/2017 Chen et al.
2018/0038513 A1 2/2018 Baldea et al.
2018/0043660 A1 2/2018 Kang et al.
2018/0058429 A1 3/2018 Kwon et al.
2019/0203039 A1 7/2019 Seo et al.
2019/0210111 A1 7/2019 Army et al.
2020/0009826 A1 1/2020 Brown et al.
2020/0316684 A1 10/2020 Shuck
2021/0020263 A1 1/2021 Pasini et al.
2021/0071020 A1 3/2021 Hu
2021/0085856 A1 3/2021 Ding
2021/0229350 A1 7/2021 Chaffins et al.
2021/0238748 A1 8/2021 Andreatta
2021/0277937 A1 9/2021 Elbibary et al.
2021/0372286 A1 12/2021 Chakrabarti et al.
2022/0034592 A1 2/2022 Maynard et al.
2022/0089799 A1 3/2022 Wang et al.
2023/0080512 A1 3/2023 Merritt et al.
2023/0085189 A1 3/2023 Merritt et al.
2023/0142146 A1 5/2023 Kilchyk
2023/0227680 A1 7/2023 Hu
2023/0304506 A1 9/2023 Kilchyk et al.
2025/0033270 A1 1/2025 Merritt et al.
2025/0033271 A1 1/2025 Merritt et al.
2025/0033272 A1 1/2025 Merritt et al.
2025/0033282 A1 1/2025 Merritt et al.
2025/0033283 A1 1/2025 Merritt et al.
2025/0033796 A1 1/2025 Merritt et al.
2025/0083795 A1 3/2025 Kilchyk et al.
2025/0084833 A1 3/2025 Kilchyk et al.
2025/0084834 A1 3/2025 Kilchyk et al.
2025/0084859 A1 3/2025 Kilchyk et al.
2025/0085725 A1 3/2025 Kilchyk et al.
2025/0088125 A1 3/2025 Kilchyk et al.
2025/0089567 A1 3/2025 Kilchyk et al.
2025/0089568 A1 3/2025 Kilchyk et al.

FOREIGN PATENT DOCUMENTS

DE 102014225229 A1 6/2016
EP 2025777 A2 2/2009
EP 2974954 A1 1/2016
EP 2960497 B1 12/2016
EP 4177440 A1 5/2023
EP 4209681 A1 7/2023
EP 4219959 A2 8/2023
EP 4411108 A2 8/2024

(56) References Cited

FOREIGN PATENT DOCUMENTS

| | | | |
|---|---|---|---|
| GB | 2472053 | A | 1/2011 |
| JP | 2007023361 | A | 2/2007 |
| JP | 2011148037 | A | 8/2011 |
| JP | 2022121766 | A | 8/2022 |
| KR | 20130005989 | A | 1/2013 |
| WO | 2015006438 | A1 | 1/2015 |
| WO | 2018108908 | A1 | 6/2018 |
| WO | 2019108203 | A1 | 6/2019 |
| WO | 2019162754 | A1 | 8/2019 |

OTHER PUBLICATIONS

Lim, Teik-Cheng "Metamaterial with sign-toggling thermal expansivity inspired by Islamic motifs in Spain", Journal of Science: Advanced Materials and Devices, vol. 7, No. 1, Mar. 2022, 6 pages.

Markforged "Onyx FR-A and Carbon Fiber FR-A: Aerospace-Ready Materials", markforged.com, Jul. 26, 2021, pp. 1-6.

Micalizzi, Simone et al., Shape-memory actuators manufactured by dual extrusion multimaterial 3d printing of conductive and non-conductive filaments; 2019 Smart Mater. Struct. 28 105025; 13 pages.

Noughabi et al., "Detailed Design and Aerodynamic Performance Analysis of a Radial-Inflow Turbine", Applied Sciences, 2018, pp. 1-21.

Pearson et al., "Novel polyurethane elastomeric composites reinforced with alumina, aramid, and poly (p-phenylene-2, 6-benzobisoxazole) short fibers, development and characterization of the thermal and dynamic mechanical properties", Composites Part B: Engineering 122 (2017): 192-201.

Schmiedeke, et al. "Experimental Investigation of Two Switching States of an Active Foil Bearing during Start-Up", Machines 2022, Published Jun. 6, 2022, 18 pages.

Wei, et al., "An overview of laser-based multiple metallic material additive manufacturing: from macro-to micro-scales", International Journal of Extrem. Manuf. 3 (2021), pp. 1-33.

Zhan et al., "Metal-plastic hybrid 3D printing using catalyst-loaded filament and electroless plating", Additive Manufacturing, 2020, pp. 1-7.

Zhiguo et al., "Determination of thermal expansion coefficients for unidirectional fiber-reinforced composites", Chinese Journal of Aeronautics, 2014, pp. 1-14.

European Search Report for Application No. 24196227.3, maield Oct. 31, 2024, 10 pages.

European Search Report for Application No. 24196233.1, mailed Oct. 31, 2024, 10 pages.

European Search Report for Application No. 24198989.6, mailed Nov. 4, 2024, 11 pages.

Doering et al., "Micromachined thermoelectrically driven cantilever structures for fluid jet deflection" [1992] Proceedings IEEE Micro Electro Mechanical Systems. IEEE, (Feb. 1992) pp. 12-18.

European Search Report for Application No. 24188681.1, mailed Dec. 4, 2024, 10 pages.

European Search Report for Application No. 24188696.9, mailed Dec. 16, 2024, 8 pages.

European Search Report for Application No. 24188713.2, mailed Jan. 2, 2025, 6 pages.

European Search Report for Application No. 24188714.0, mailed Dec. 13, 2024, 10 pages.

European Search Report for Application No. 24190738.5, mailed Jan. 13, 2025, 8 pages.

European Search Report for Application No. 24196219.0, mailed Jan. 13, 2025, 8 pages.

European Search Report for Application No. 24196295.0, mailed Jan. 29, 2025, 16 pages.

European Search Report for Application No. 24196309.9, mailed Jan. 28, 2025, 10 pages.

European Search Report for Application No. 24199023.3, mailed Feb. 21, 2025, 15 pages.

European Search Report for Application No. 24199038.1, mailed Jan. 31, 2025, 8 pages.

European Search Report for Application No. 24199041.5, mailed Jan 28, 2025, 8 pages.

Jerman "Electrically-activated, micromachined diaphragm valves" IEEE 4th Technical Digest on Solid-State Sensor and Actuator Workshop, Hilton Head, SC, USA, (Jun. 1990) pp. 65-69.

Jerman et al., "Electrically activated normally closed diaphragm valves" Journal of Micromechanics and Microengineering 4.4 (Dec. 1994) pp. 210-216.

Partial European Search Report for Application No. 24196240.6, mailed Feb. 7, 2025, 16 pages.

Richardson,, "The aerospace secret standard", Apr. 12, 2019, Aerospace Manufacturing, www.aero-mag.com/the-aerospace-secret-standard; 8 pages.

European Search Report for Application No. 24182403.6, dated Jun. 2, 2025, pp. 1-11.

European Search Report for EP Application No. 24196240.6, dated Apr. 28, 2025, pp. 1-13.

Lazarus et al., "Direct electroless plating of conductive thermoplastics for selective metallization of 3D printed parts", Additive Manufacturing, vol. 55, Mar. 30, 2022, pp. 1-11.

Giani et al., "Towards sustainability in 3D printing of thermoplastic composites: Evaluation of recycled carbon fibers as reinforcing agent for FDM filament production and 3D printing", Composites: Part A 159, 2002, pp. 1-12.

Tammaro et al., "Reinforcing Efficiency of Recycled Carbon Fiber PLA Filament Suitable for Additive Manufacturing", Polymers 2024, pp. 1-17.

Hao et al., "A Review of Smart Materials for the Boost of Soft Actuators, Soft Sensors, and Robotics Applications", Chinese Journal of Mechanical Engineering, 2022, pp. 1-16.

* cited by examiner

90
R2
105

R1
52
105
140
105C
105D
105A
105E
105
120
100
130
90
54
105B 90
80
270

75
250
310
80
260
320

(T2 > T1)

AIRCRAFT AIRFOIL FORMED FROM THERMALLY ADAPTIVE MATERIALS AND INCLUDING DAMPING ELEMENT, STIFFENING ELEMENT, AND A THERMOELECTRIC JUNCTION

CROSS-REFERENCE TO RELATED APPLICATIONS

This application is a continuation-in-part of U.S. application Ser. No. 18/464,165 filed Sep. 8, 2023, U.S. application Ser. No. 18/464,139 filed Sep. 8, 2023, U.S. application Ser. No. 18/464,142 filed Sep. 8, 2023, U.S. application Ser. No. 18/464,147 filed Sep. 8, 2023, U.S. application Ser. No. 18/464,153 filed Sep. 8, 2023, U.S. application Ser. No. 18/464,157 filed Sep. 8, 2023, U.S. application Ser. No. 18/464,159 filed Sep. 8, 2023, U.S. application Ser. No. 18/464,160 filed Sep. 8, 2023, U.S. application Ser. No. 18/464,163 filed Sep. 8, 2023 and U.S. application Ser. No. 18/464,164 filed Sep. 8, 2023, the disclosures of each of which are incorporated herein by reference in their entirety.

BACKGROUND

The embodiments are directed to an airfoil of an aircraft and more specifically to an airfoil, of an aircraft, that is formed from thermally adaptive materials and including damping element, stiffening element, and a thermoelectric junction.

Memory shape alloys may be utilized for various applications to avoid the requirement of utilizing complex machinery. However, working fluid temperatures may undesirably control the shape of the alloy.

BRIEF DESCRIPTION

Disclosed is an airfoil, including a body defining a leading edge and a trailing edge, wherein the body comprises: a base having an outer boundary extending longitudinally from a first end to a second end and transversely from a first side to a second side; and beads within the outer boundary, wherein each of the beads has a bead void, and wherein one or more of the beads includes: damping element within the bead void; or stiffening element extending across the bead.

In addition to one or more aspects of the airfoil, or as an alternate, one or more of the beads includes: the damping element within the bead void; and the stiffening element extending across the bead.

In addition to one or more aspects of the airfoil, or as an alternate, the damping element is a thermoplastic.

In addition to one or more aspects of the airfoil, or as an alternate, the stiffening element is a reinforcement fiber.

In addition to one or more aspects of the airfoil, or as an alternate, the stiffening element one of: a metal fiber; a carbon fiber; and a fiberglass fiber.

In addition to one or more aspects of the airfoil, or as an alternate, each of the beads is nonmetal.

In addition to one or more aspects of the airfoil, or as an alternate, each of the beads defines: first and second perimeter segments that are opposite each other and have a first CTE; and third and fourth perimeter segments that are opposite each other and adjacent to the first and second perimeter segments and have a second CTE that differs from the first CTE, to define a bead CTE gradient.

In addition to one or more aspects of the airfoil, or as an alternate, a thermoelectric junction is disposed around the outer boundary or in one or more of the bead voids.

In addition to one or more aspects of the airfoil, or as an alternate, one or more of the beads includes two or more of: the thermoelectric junction; the damping element within the bead void; or the stiffening element extending across the bead.

In addition to one or more aspects of the airfoil, or as an alternate, one or more of the beads includes each of: the thermoelectric junction; the damping element within the bead void; and the stiffening element extending across the bead.

In addition to one or more aspects of the airfoil, or as an alternate, each of the beads defines: an outer surface; and an inner surface, wherein the inner surface defines the bead void, wherein: the outer surface of the first and second perimeter segments has the first CTE, and the inner surface of the first and second perimeter segments has the second CTE; and the outer surface of the third and fourth perimeter segments has the second CTE, and the inner surface of the third and fourth perimeter segments has the first CTE.

In addition to one or more aspects of the airfoil, or as an alternate, the outer boundary defines a first outer end and a second outer end, wherein the first and second outer ends are opposite each other, and the base includes a top elastomer layer that is disposed against the first outer end of the outer boundary and a bottom elastomer layer that is disposed against the second outer end of the outer boundary.

In addition to one or more aspects of the airfoil, or as an alternate, the base includes an elastomer segment that extends from each of the beads that are located along the outer boundary of the base, so that adjacent ones of the elastomer segments overlap each other to define a flexible outer boundary cover.

In addition to one or more aspects of the airfoil, or as an alternate, the base is formed as a block having base voids, wherein each of the base voids is lined with one of the beads.

In addition to one or more aspects of the airfoil, or as an alternate, the block is nonmetal.

In addition to one or more aspects of the airfoil, or as an alternate, each of the beads is oval shaped or diamond shaped.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1A:
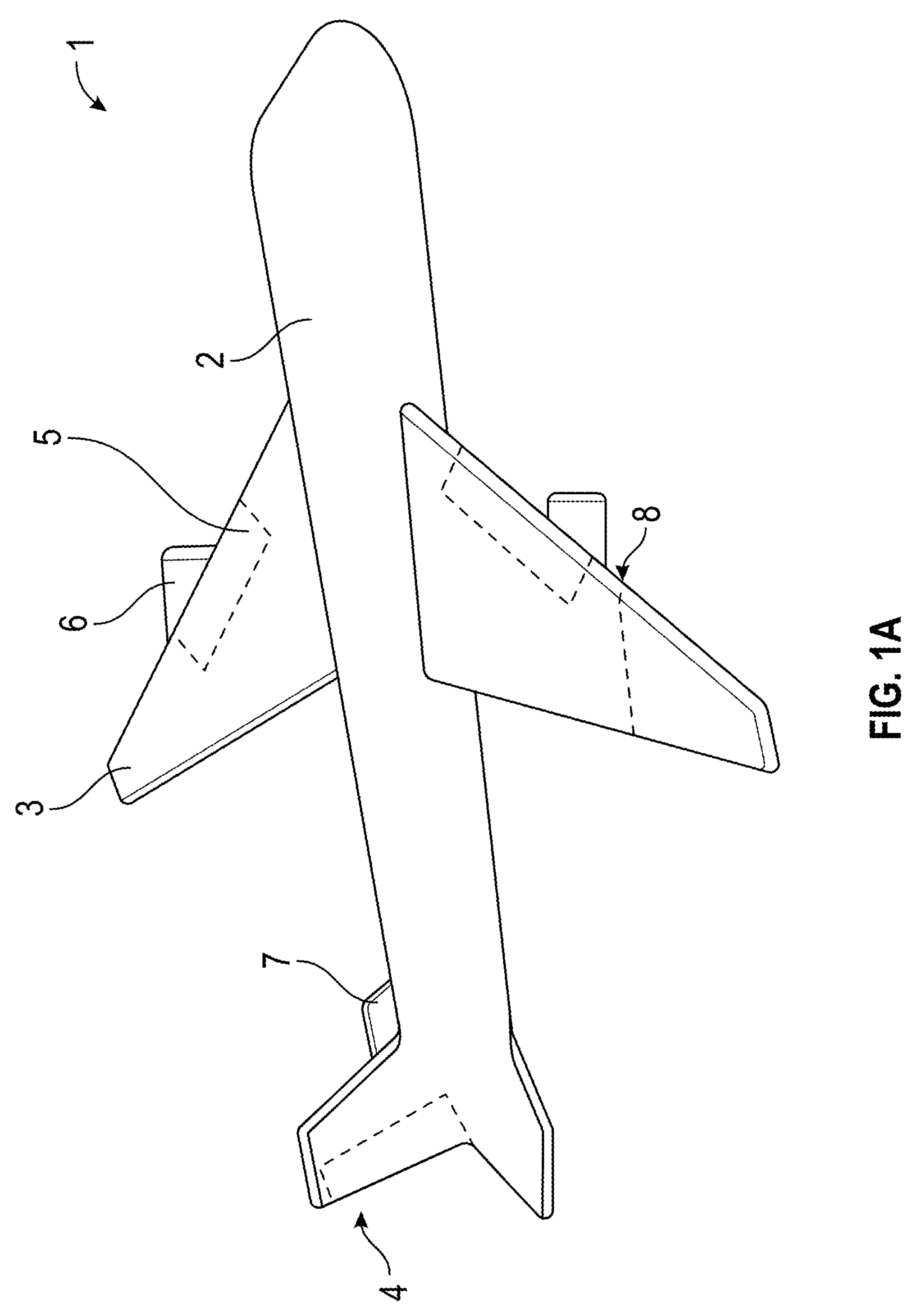
FIG. 1A shows an aircraft according to an embodiment.

FIG. 1A shows an aircraft 1 having a fuselage 2 with a wing 3 and tail assembly 4, which may have control surfaces 5. The wing 3 may include an engine 6, such as a gas turbine engine, and an auxiliary power unit 7 may be disposed at the tail assembly 4.

Figures 1B, 1C:
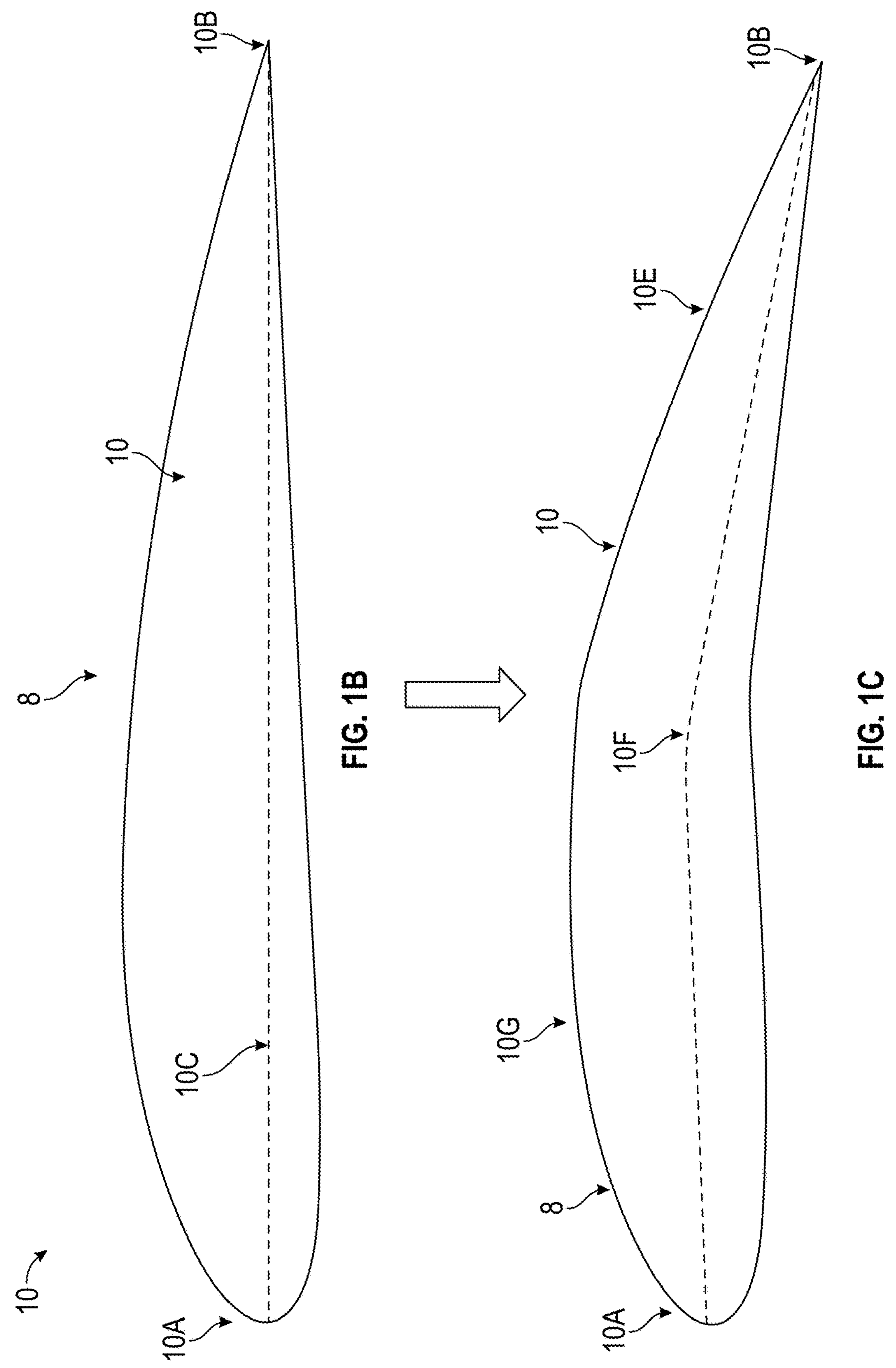
FIG. 1B shows a component of the aircraft according to an embodiment, where the component is an airfoil with a first camber profile.
FIG. 1C shows the same airfoil of FIG. 1B with a second camber profile.

Turning to FIGS. 1B and 1C, an airfoil 8 is disclosed. The airfoil 8 includes a body 10 defining a leading edge 10A and a trailing edge 10B and a cord 10C. A trailing section 10E extends from the trailing edge 10B to an intermediate point 10F, intermediate the leading and trialing edges 10A, 10B. The point 10F may be center cord, quarter cord (from the front), or another location. A leading section 10G extends from the leading edge 10A to the intermediate point 10F. The materials utilized for the airfoil 8 enable predetermined elastic deformation and therefore movement of the trailing section 10E relative to the leading section 10G, e.g., to desirably change camber and therefore lift characteristics for takeoff, during flight and landing. In one embodiment, the airfoil 8 is additively manufactured.

Figure 2:
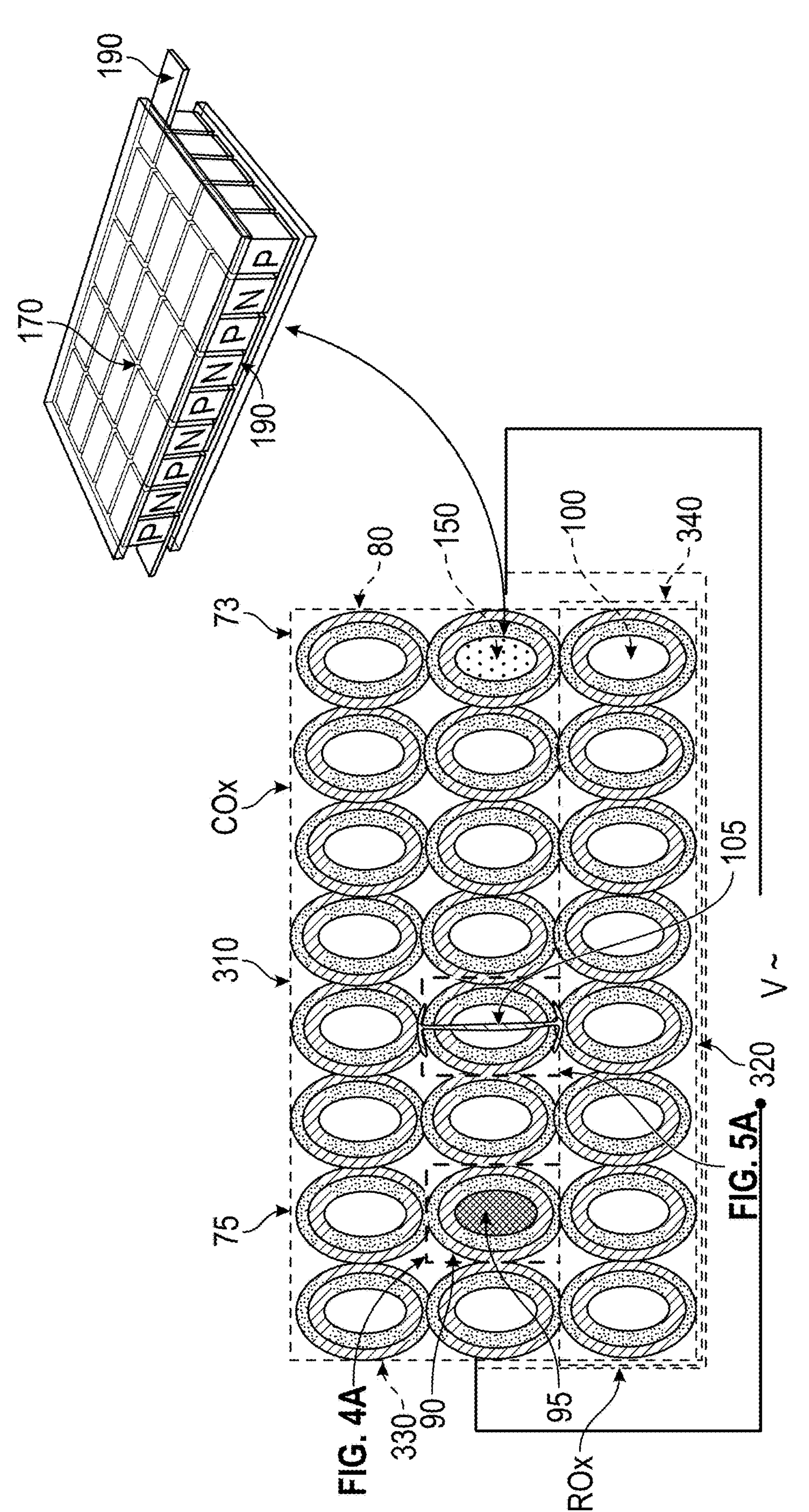
FIG. 2 shows a material configuration of the component, having a base formed of a lattice of beads having coefficient of thermal expansion (CTE) gradients selected to provide a predetermined deformation, and where the lattice is formed with one or more of a damping element, a stiffening element and a thermoelectric junction.

Turning to FIG. 2, the body 10 has a base 70 (or body segment) having an outer boundary 80 extending longitudinally from a first end 310 to a second end 320 and transversely from a first side 330 to a second side 340. Beads 90 are within the outer boundary 80. In FIG. 2, the beads 90 are arranged as a lattice 73 of three rows R0$x$ and nine columns C0$x$, but this is not intended on limiting the arrangement of the beads 90. The beads 90 may be metal such as a bistable material, or nonmetal, such as thermoplastic. Each of the beads 90 has a bead void 100 so that each bead 90 formed a closed loop.

According to the embodiments, one or more of the beads 90 includes a damping element (i.e., damping material) 95 within the bead void 100. The damping element 95 may be a thermoplastic. In addition, or alternatively, the one or more of the beads 90 includes a stiffening element (or a stiffening material) 105 extending across the bead 90, e.g., over the void 100. The stiffening element 105 may be a reinforcement fiber. The fiber may be a metal fiber, a carbon fiber, or a fiberglass fiber, as nonlimiting examples.

Figure 3B:
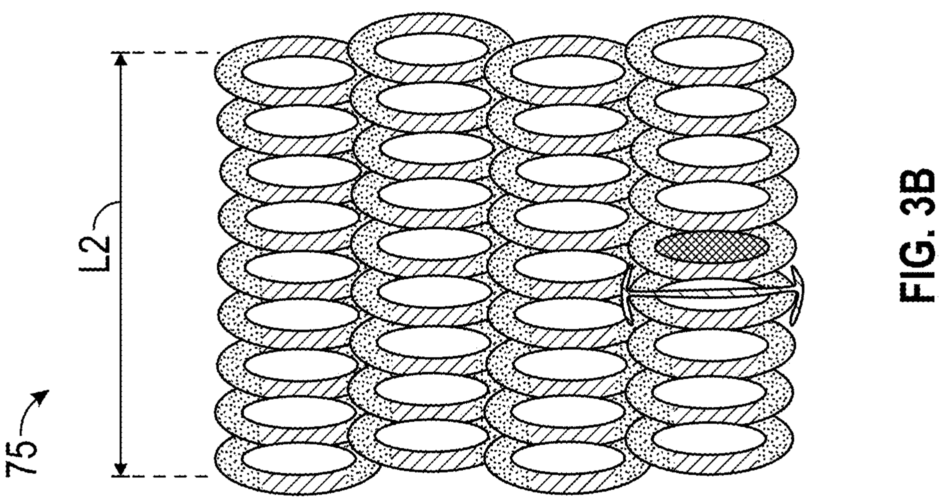
FIG. 3B shows the lattice of beads in a deformed state.
Figure 3A:
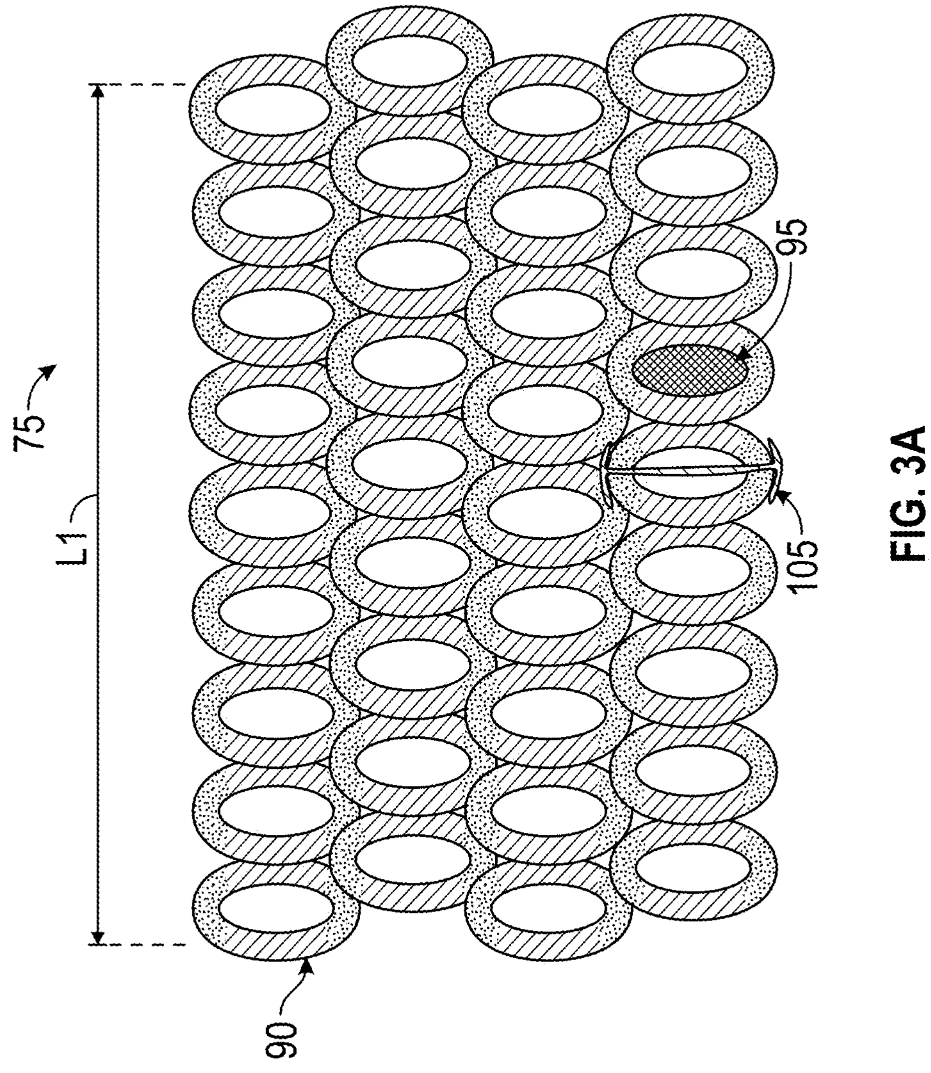
FIG. 3A shows the lattice of beads in a normal state.

As shown in FIG. 3A, the lattice 73 of beads 90 may have a first length L1 (or longitudinal span) before being subjected to thermal energy. As shown in FIG. 3B, the lattice 73 may have a second length L2 after being subjected to thermal energy, where the second length L2 is less than the first length L1.

Figure 4A:
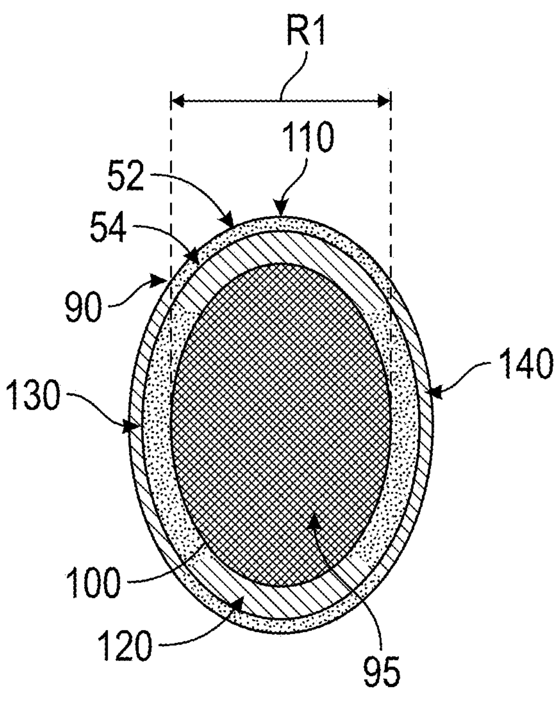
FIG. 4A shows one of the beads formed with damping element.

As shown in FIG. 4A, in addition to having the damping element 95 in the bead void 100, each of the beads 90 may define first and second perimeter segments 110, 120 that are opposite each other and have a first CTE. Third and fourth perimeter segments 130, 140 may be opposite each other and adjacent to the first and second perimeter segments 110, 120. The third and fourth perimeter segments 130, 140 may have a second CTE that differs from the first CTE, to define a bead CTE gradient. In some embodiments, each of the beads 90 may have an outer surface 52 and an inner surface 54. The inner surface 54 defines the bead void 100. The outer surface 52 of the first and second perimeter segments 110, 120 may have the first CTE. The inner surface 54 of the first and second perimeter segments 110, 120 may have the second CTE. The outer surface 52 of the third and fourth perimeter segments 130, 140 may have the second CTE. The inner surface 54 of the third and fourth perimeter segments 130, 140 may have the first CTE. Thus each segment of the beads 90 may form a segment CTE gradient that is the opposite the adjacent CTE gradient and the same as the opposite bead segment.

Figure 4B:
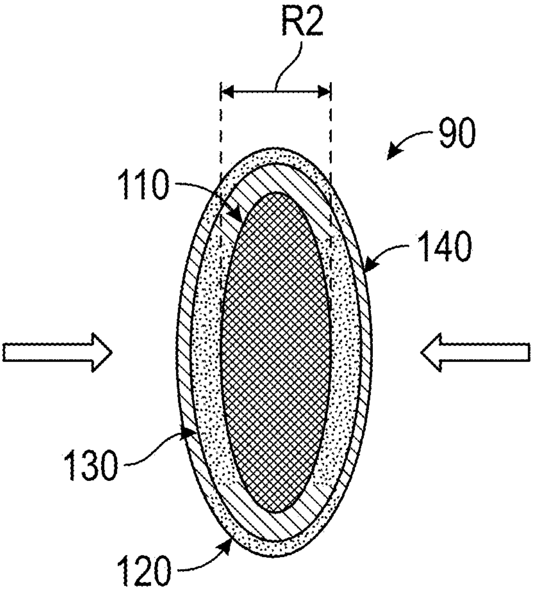
FIG. 4B shows the bead of FIG. 4A in a deformed state.

As shown in FIG. 4B, the bead 90 may deform to a predetermined shape when subject to thermal energy. For example, the bead 90 may deform from an oval with a first radius R1 along its short axis to an oval with a second radius R2 along the short axis that is smaller than the first radius R1. The damping element 95 may prevent unwanted vibrations during deformation and when the material returns to its normal state (FIG. 4A).

Figures 5A, 5B:
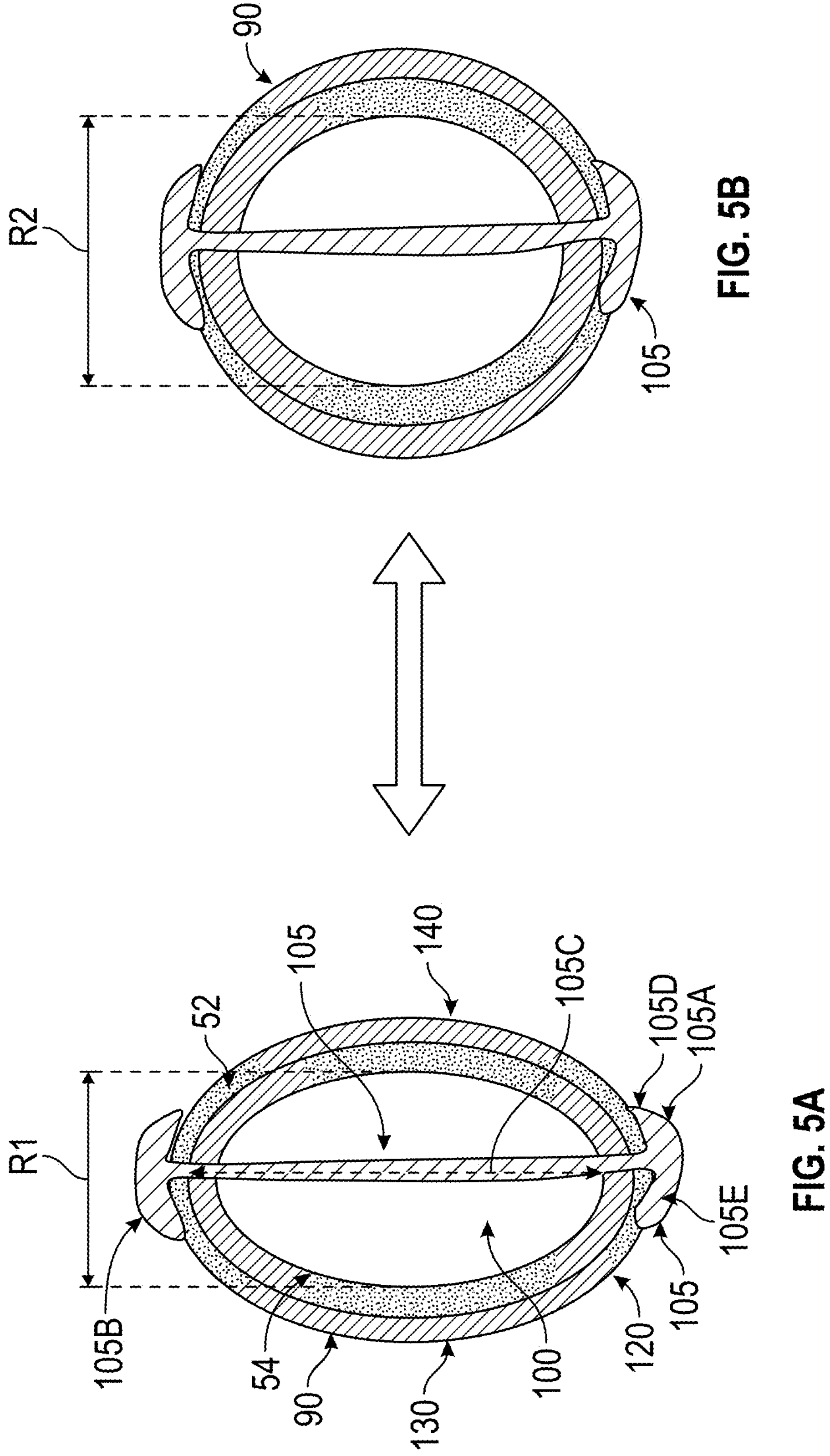
FIG. 5A shows one of the beads formed with stiffening element.
FIG. 5B shows the bead of FIG. 5A in a deformed state.

As shown in FIG. 5A, in addition to having the stiffening element 105 extending across the bead 90, over the bead void 100, each of the beads 90 may define first and second perimeter segments 110, 120 that are opposite each other and have a first CTE. Third and fourth perimeter segments 130, 140 may be opposite each other and adjacent to the first and second perimeter segments 110, 120. The third and fourth perimeter segments 130, 140 may have a second CTE that differs from the first CTE, to define a bead CTE gradient. In some embodiments, each of the beads 90 may have an outer surface 52 and an inner surface 54. The inner surface 54 defines the bead void 100. The outer surface 52 of the first and second perimeter segments 110, 120 may have the first CTE. The inner surface 54 of the first and second perimeter segments 110, 120 may have the second CTE. The outer surface 52 of the third and fourth perimeter segments 130, 140 may have the second CTE. The inner surface 54 of the third and fourth perimeter segments 130, 140 may have the first CTE. Thus each segment of the beads 90 may form a segment CTE gradient that is the opposite the adjacent CTE gradient and the same as the opposite bead segment.

As indicated, the stiffening element 105 may extend to the outer surface 52 of the first and second segments 110, 120.

The stiffening element 105 at each end 105A, 105B may extend circumferentially over a portion of the outer surface 52, in either direction away from an axis 105C extending through the stiffening element 105. Thus each end 105A, 105B has securing tabs 105D, 105E formed by the stiffening element 105 to secure it to the bead 90. However, this is not intended on limiting the configuration of the stiffening element 105.

As shown in FIG. 5B, the bead 90 may deform to a predetermined shape when subject to thermal energy. For example, the bead 90 may deform from an oval with a first radius R1 along its short axis to an oval with a second radius R2 along the short axis that is smaller than the first radius R1. The stiffening element 105, as with the damping element 95, may prevent unwanted vibrations during deformation and when the material returns to its normal state (FIG. 5A).

Turning back to FIG. 2, a thermoelectric junction 150 may be disposed around the outer boundary 80, as illustrated around the second end 320 and portions of the first and second sides 330, 340, as non-limiting embodiments, or in one or more of the bead voids 100. This may enable selectively adding thermal energy to the lattice 73 to obtain the predetermined deformation, such as the actuation of the actuator 10.

The thermoelectric junction 150 may form a Peltier or a Thomson device. For example, alternating P and N-type pillars made with materials with different Seebeck coefficients, or legs, are placed thermally in parallel to each other and electrically in series and joined with a thermally conducting plate on each side, e.g., ceramic, including a cooling plate 160 and a heating plate 170. When a voltage is applied to the free ends of the two semiconductors, via connections 190 there is a flow of DC current across the junction of the semiconductors, causing a temperature difference. The side with the cooling plate 160 absorbs heat which is then transported by the semiconductor to the other side of the device. One of the cooling plate 160 or heating plate 170 may be exposed to the atmosphere if desired to bleed energy from it rather than directing energy from it back to the component 10.

It is within the scope of the embodiments for one or more of beads 90 to includes combinations of the thermoelectric junction 150 within the bead void 100 or around the outer boundary 80, the damping element 95 within the bead void 100, the stiffening element 105 extending across the bead 90.

Figures 6, 7:
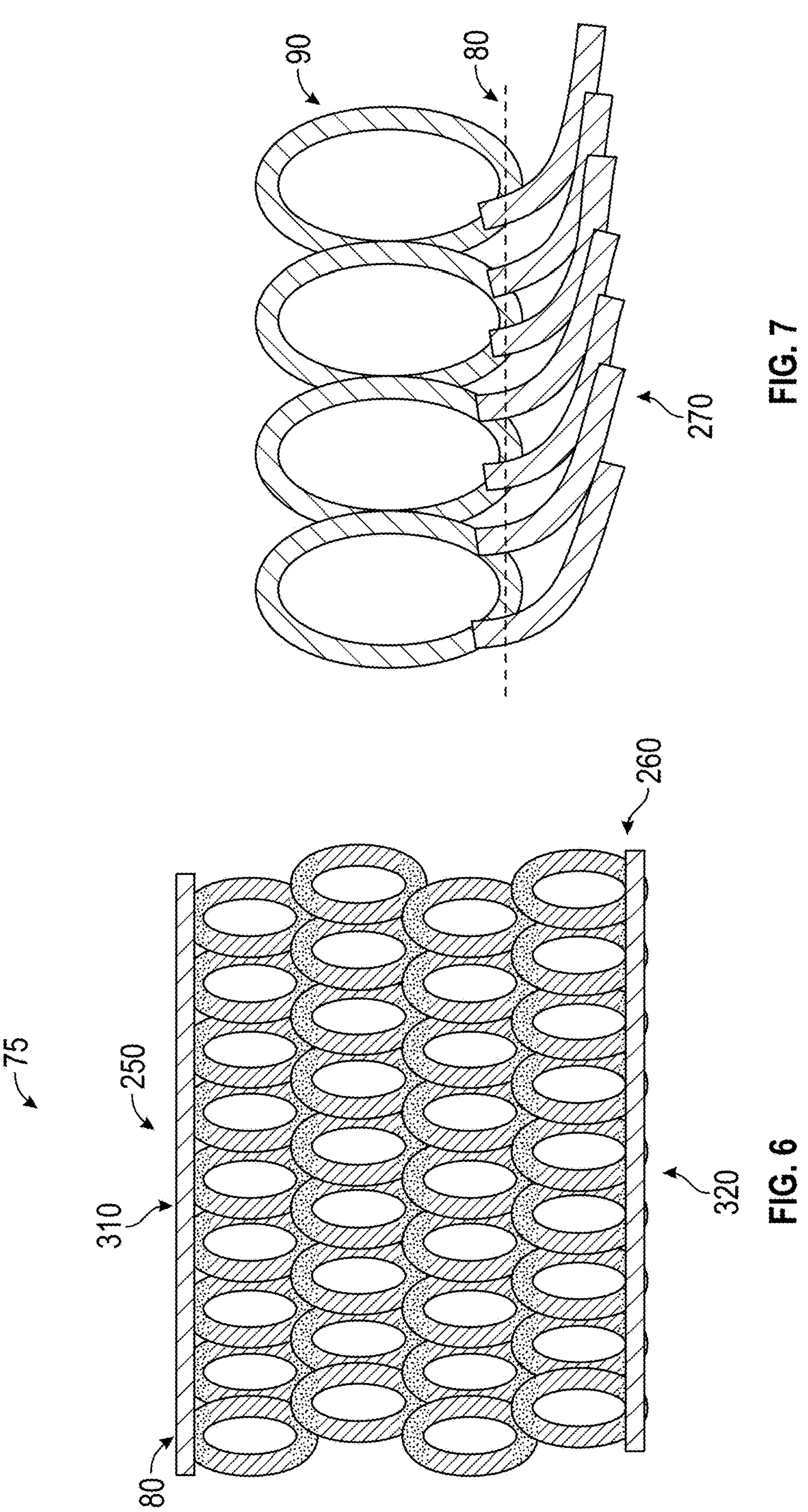
FIG. 6 shows the lattice of beads with top and bottom elastomer layers.
FIG. 7 shows a plurality of the beads from the lattice, with an elastomer segment extending from each bead, over an adjacent bead, to form a continuous elastomer boundary.

Turning to FIG. 6, the first and second ends 310, 320, along the outer boundary 80 of the base 75 may include a top elastomer layer 250 and a bottom elastomer layer 260. These layers may be utilized for enclosing the beads 90.

Turning to FIG. 7, the base 75 may include an elastomer segment 270 that extends from each of the beads 90 that are located along the outer boundary 80. As a result, adjacent ones of the elastomer segments 270 may overlap each other to define a flexible outer boundary cover.

Figures 8A, 8B:
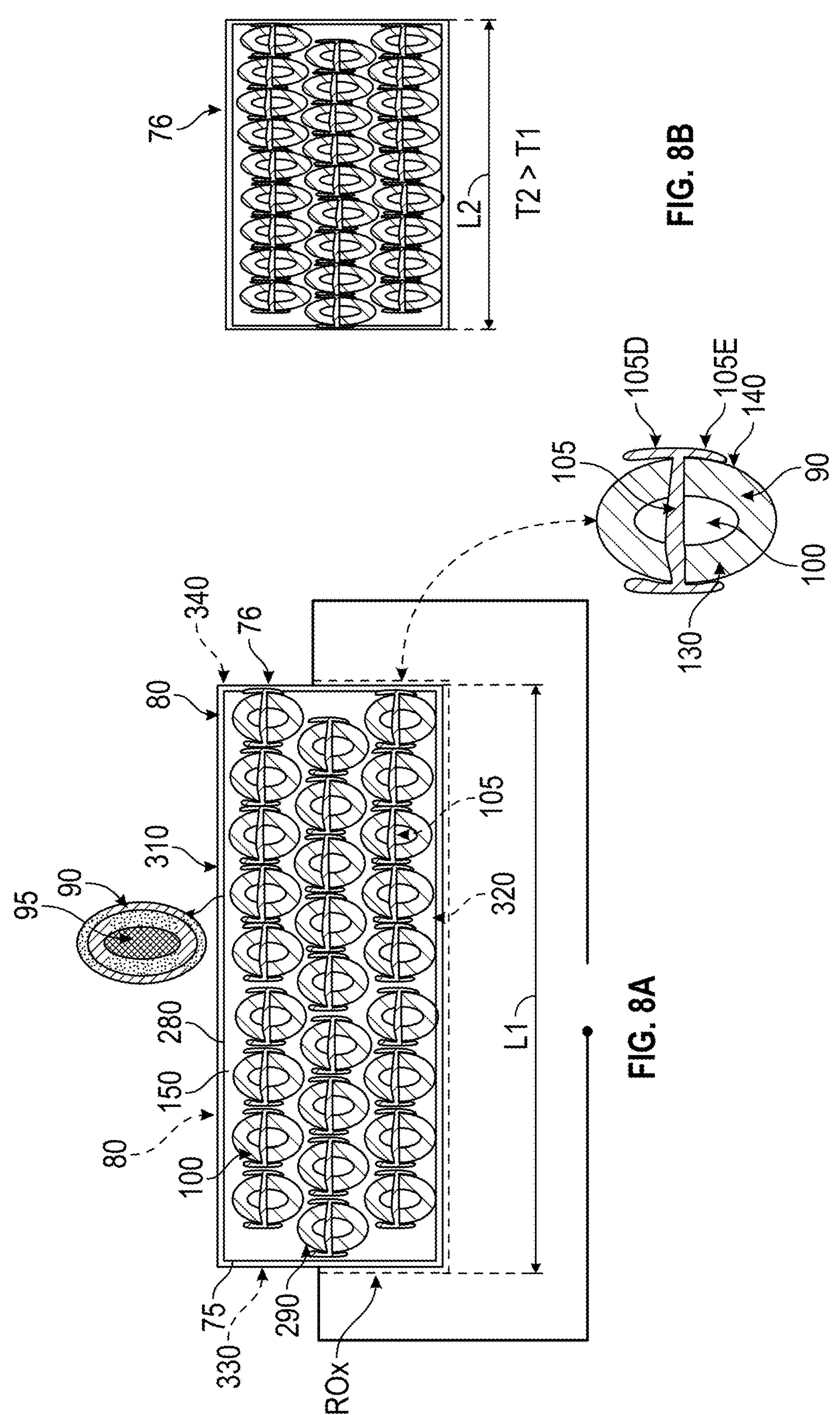
FIG. 8A shows an alternate configuration of the material configuration of the component, having a block shaped base that defines voids, where ones of the voids are lined with one of the beads, and one or more of: damping element formed in one or more of the beads; stiffing material formed across one or more of the beads; and a thermoelectric junction formed either within at least one of the beads or around the base.
FIG. 8B shows the block of FIG. 8A in a deformed state.

Turning to FIG. 8A, the base 75 may be formed as a block 76 having an outer surface 77 defining the outer boundary 80 having the geometry identified in FIG. 2, including the first and second ends 310, 320 and the first and second sides 330, 340. The block 76 may define base voids 290, distributed in rows ROx, with three rows shown. Adjacent rows ROx are offset from each other, though they may be aligned in an alternative embodiment to form columns of beads 90 (FIG. 2). Each of the base voids 290 may be lined with one of the beads 90. The block 76 may be metal, such as a bistable metal, or nonmetal, such as a thermoplastic.

The thermoelectric junction 150 may be disposed around the outer boundary 80 of the block 75, as illustrated around the second end 320 and portions of the first and second sides 330, 340, as non-limiting embodiments, or in one or more of the bead voids 100. The stiffening element 105 may extend across bead 90 from the outer surface 52 between the third and fourth segments 130, 140 to form the securing tabs 105D, 105E along these segments 130, 140.

As shown in FIG. 8A, a block 75 containing the beads 90 may have a first length L1 (or longitudinal span) before being subjected to thermal energy. As shown in FIG. 8B, the block 75 may have a second length L2 after being subjected to thermal energy, where the second length L2 is less than the first length L1.

Figures 9A, 9B, 10A, 10B, 11A, 11B:
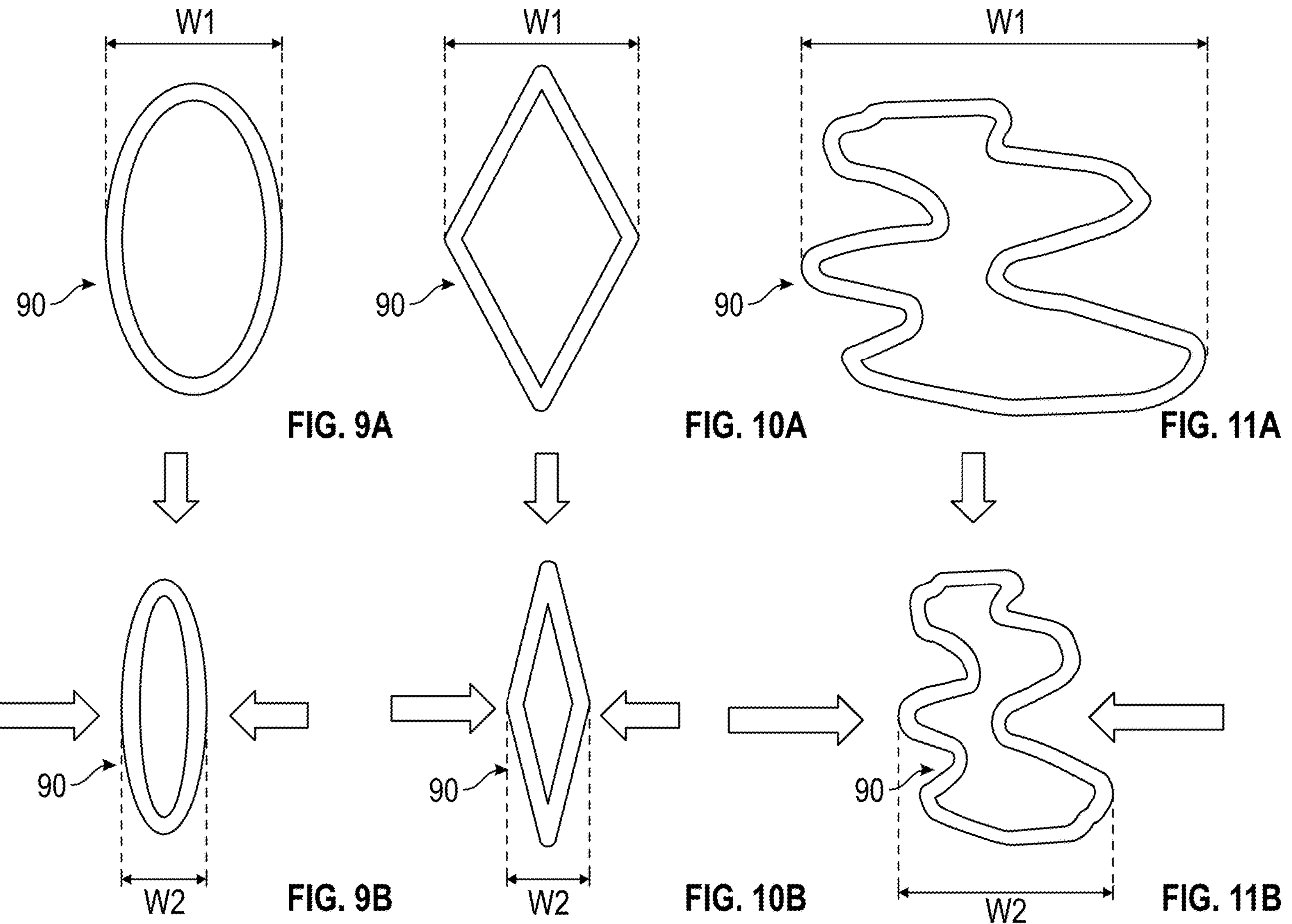
FIG. 9A shows an oval shaped bead that may be utilized in the disclosed embodiments.
FIG. 9B shows the bead of FIG. 9A in a deformed state.
FIG. 10A shows a diamond shaped bead that may be utilized in the disclosed embodiments.
FIG. 10B shows the bead of FIG. 10A in a deformed state.
FIG. 11A shows a random shaped bead that may be utilized in the disclosed embodiments.
FIG. 11B shows the bead of FIG. 11A in a deformed state.

FIG. 9A shows an oval shaped bead 90, which may be formed as indicated above, in a normal state having a first width W1. FIG. 9B shows the oval bead 90 in a deformed state having a second width W2 that is less than the first width W1. As indicated, the beads 90 do not need to be arcuate in shape. FIG. 10A shows a diamond shaped bead 90 in a normal state having a first width W1. FIG. 10B shows the diamond shaped bead 90 in a deformed state having a second width W2 that is less than the first width W1. FIG. 11A shows a random shaped bead 90 in a normal state having a first width W1. FIG. 11B shows the random shaped bead 90 in a deformed state having a second width W2 that is less than the first width W1. The desired deformation shape may determine the shape of the bead 90.

Figure 12A:
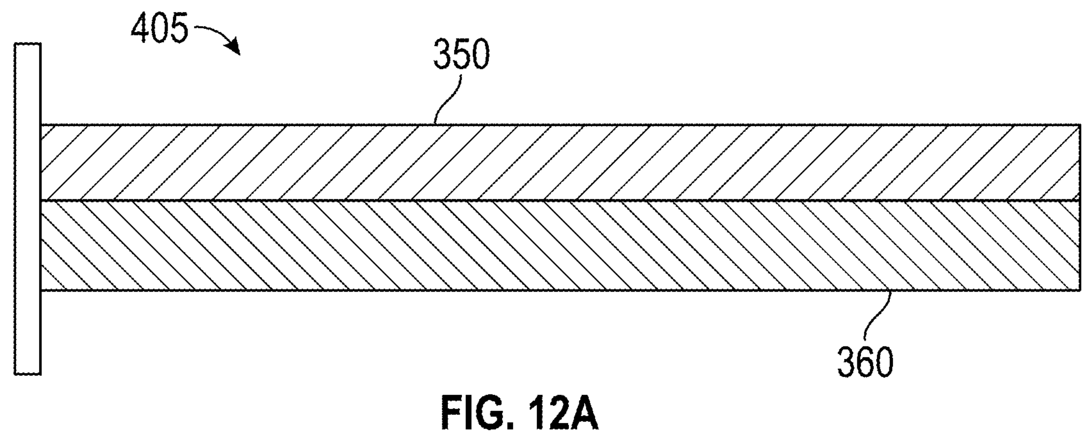
FIG. 12A shows an equivalent structure the structures shown above and for example in FIGS. 2-4.
Figure 12B:
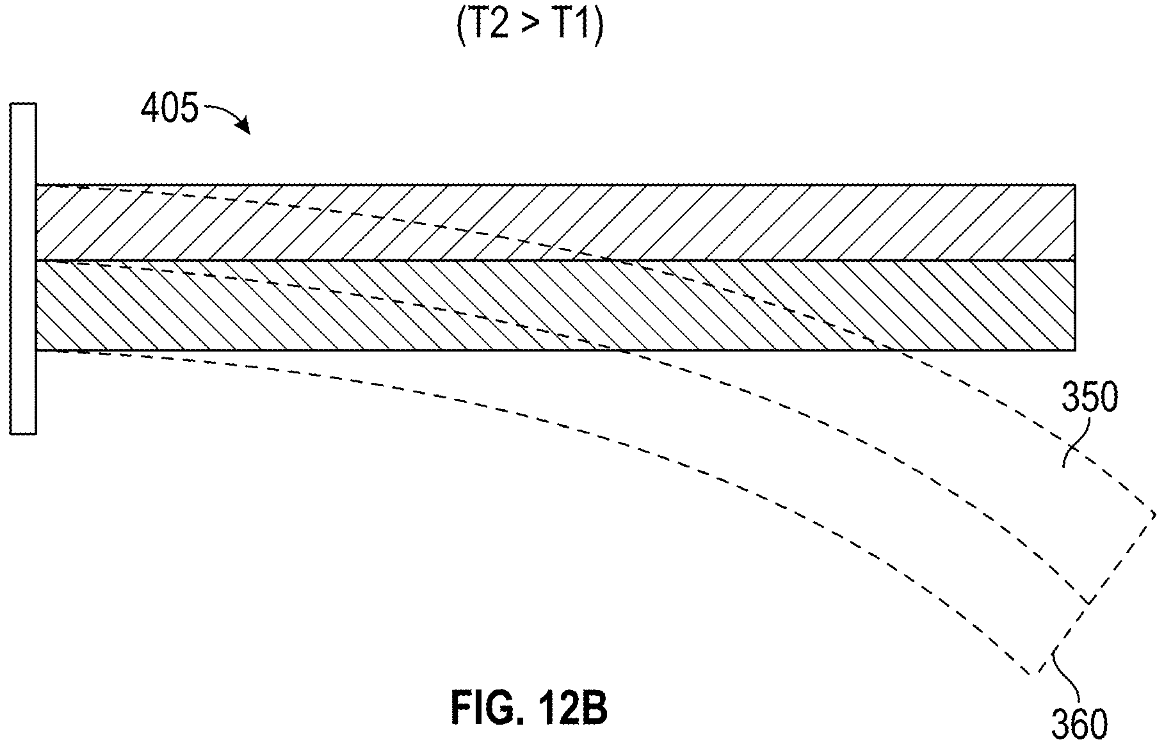
FIG. 12B shows the structure of FIG. 12A at a temperature T2>T1 and in a deformed state.

FIGS. 12A and 12B show a linear equivalent structure 405 to the beads 90. Specifically, the first and second segment 350, 360 are at a temperature T1 in FIG. 12A, and T2 that is greater than T1 in FIG. 12B, i.e., they have received thermal input. The controlled thermal expansion shown in FIG. 12B results from the segments being integrally connected. That is, the first and second segments 350, 360 bend together in a predictable and controlled way. That is, the controlled thermal expansion of the first and second segments 350, 360 in the disclose embodiments provides for controlled manipulation of the component disclosed herein.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. An airfoil, comprising:

a body defining a leading edge and a trailing edge, wherein the body comprises:

a base having an outer boundary extending longitudinally from a first end to a second end and transversely from a first side to a second side; and beads within the outer boundary, wherein each of the beads has a bead void, and wherein one or more of the beads includes:

the damping element within the bead void; and the stiffening element extending across the bead.

2. The airfoil of claim 1, wherein the one or more of the beads includes the damping element within the bead void, and wherein the damping element is a thermoplastic.

3. The airfoil of claim 1, wherein each of the beads is nonmetal.

4. The airfoil of claim 1, wherein each of the beads is oval shaped or diamond shaped.

5. An airfoil, comprising:

a body defining a leading edge and a trailing edge, wherein the body comprises:

a base having an outer boundary extending longitudinally from a first end to a second end and transversely from a first side to a second side; and beads within the outer boundary, wherein each of the beads has a bead void, and wherein one or more of the beads includes:

a damping element within the bead void; and a stiffening element extending across the bead, wherein:

the stiffening element is a reinforcement fiber.

6. The airfoil of claim 5, wherein the stiffening element is one of: a metal fiber; a carbon fiber; and a fiberglass fiber.

7. The airfoil of claim 5, wherein each of the beads is oval shaped or diamond shaped.

8. The airfoil of claim 5, wherein the one or more of the beads includes the damping element within the bead void, and wherein the damping element is a thermoplastic.

9. The airfoil of claim 5, wherein each of the beads is nonmetal.

10. An airfoil, comprising:

a body defining a leading edge and a trailing edge, wherein the body comprises:

a base having an outer boundary extending longitudinally from a first end to a second end and transversely from a first side to a second side; and beads within the outer boundary, wherein each of the beads has a bead void, and wherein one or more of the beads includes:

damping element within the bead void; or a stiffening element extending across the bead, wherein:

each of the beads defines:

first and second perimeter segments that are opposite each other and have a first CTE; and third and fourth perimeter segments that are opposite each other and adjacent to the first and second perimeter segments and have a second CTE that differs from the first CTE, to define a bead CTE gradient.

11. The airfoil of claim 10, wherein:

a thermoelectric junction is disposed around the outer boundary or in one or more of the bead voids.

12. The airfoil of claim 11, wherein:

one or more of the beads includes two or more of:

the thermoelectric junction;

the damping element within the bead void; or the stiffening element extending across the bead.

13. The airfoil of claim 11, wherein:

one or more of the beads includes each of:

the thermoelectric junction;

the damping element within the bead void; and the stiffening element extending across the bead.

14. The airfoil of claim 11, wherein:

each of the beads defines:

an outer surface; and an inner surface, wherein the inner surface defines the bead void, wherein:

the outer surface of the first and second perimeter segments has the first CTE, and the inner surface of the first and second perimeter segments has the second CTE; and the outer surface of the third and fourth perimeter segments has the second CTE, and the inner surface of the third and fourth perimeter segments has the first CTE.

15. The airfoil of claim 14, wherein:

the outer boundary defines a first outer end and a second outer end, wherein the first and second outer ends are opposite each other, and the base includes a top elastomer layer that is disposed against the first outer end of the outer boundary and a bottom elastomer layer that is disposed against the second outer end of the outer boundary.

16. The airfoil of claim 14, wherein:

the base includes an elastomer segment that extends from each of the beads that are located along the outer boundary of the base, so that adjacent ones of the elastomer segments overlap each other to define a flexible outer boundary cover.

17. The airfoil of claim 14, wherein:

the base is formed as a block having base voids, wherein each of the base voids is lined with one of the beads.

18. The airfoil of claim 17, wherein the block is nonmetal.

19. The airfoil of claim 10, wherein each of the beads is oval shaped or diamond shaped.

20. The airfoil of claim 10, wherein the one or more of the beads includes the damping element within the bead void, and wherein the damping element is a thermoplastic.

* * * * *